United States Patent [19]
Bianchi et al.

[11] Patent Number: 4,601,782
[45] Date of Patent: Jul. 22, 1986

[54] REACTIVE ION ETCHING PROCESS

[75] Inventors: Jacqueline K. Bianchi, San Jose; Robert A. Gdula, Los Gatos; Dennis J. Lange, Aromas, all of Calif.

[73] Assignee: International Business Machines Corp., Armonk, N.Y.

[21] Appl. No.: 747,156

[22] Filed: Jun. 20, 1985

[51] Int. Cl.[4] .......................... B44C 1/22; C03C 15/00; C03C 25/06
[52] U.S. Cl. ..................................... 156/643; 156/646; 156/659.1; 156/663; 204/192 E; 252/79.1
[58] Field of Search ............... 252/79.1; 156/643, 646, 156/657, 659.1, 663; 204/192 EC, 192 E; 427/38, 39

[56] References Cited

U.S. PATENT DOCUMENTS 4,330,384 5/1982 Okudaira et al. ............... 204/192 E
4,447,290 5/1984 Matthews ........................... 156/626

Primary Examiner—William A. Powell
Attorney, Agent, or Firm—Joseph G. Walsh

[57] ABSTRACT

In a process for etching by reactive ion etching, a ceramic partially masked by an organic photoresist, an etch gas containing $SF_6$, a noble gas and a small percentage of a carbon-containing gas is used.

4 Claims, No Drawings

REACTIVE ION ETCHING PROCESS

TECHNICAL FIELD

The present invention is concerned with a reactive ion etching process in which a ceramic partially masked with a photoresist is etched.

BACKGROUND ART

The use of $SF_6$ as an echant gas is shown in U.S. Pat. No. 4,330,384. U.S. Pat. No. 4,447,290 also shows the use of $SF_6$ with the addition of Freon 12 as a indicator gas for the plasma etching of polysilicon. Neither of these patents, however, is concerned with the problem solved by the present invention.

DESCRIPTION OF THE INVENTION

In fabricating integrated circuits, it is sometimes desirable to etch deep pockets or holes (10 to 20 μm deep) into ceramics which are difficult or impossible to etch by conventional wet chemical means. Such etching may be accomplished by subjecting the ceramic which is partially masked by a commercial organic photoresist to reactive ion etching. However, the etch rates using conventional RIE processes are typically very slow.

Ceramics of interest can be rapidly etched by utilizing a high power density ($>1$ watt/cm$^2$) $SF_6$ RIE process, but in this process the photoresist mask is eroded much more rapidly than the ceramic is etched. In this case the mask does not endure long enough to achieve the required etch depth in the ceramic. In other words, the ratio of the etch rate of the photoresist mask to the etch rate of the ceramic is not low enough. In fact, it is so unfavorable that the mask erodes 8 times faster than the ceramic etches.

The present invention provides a solution to the problem of photoresist mask degradation during reactive ion etching processes using $SF_6$ as the echant gas. By means of the present invention, the ratio of the etch rate of the photoresist to the etch rate of a ceramic has been decreased to below 5 which is satisfactory. This is done by the addition of a small percentage of a carbon-containing gas to the etch gas mixture.

Prior to the present invention, $SF_6$ had not been a satisfactory etch gas when ceramic and photoresist were being simultaneously etched. Even though $SF_6$ makes it possible to achieve faster rates than previously obtained, it has the disadvantage of attacking the organic photoresist and causes degradataion. For example, when a resist mask comprising poly(methylmethacrylate) was etched with 100% $SF_6$, areas where resist bridged from row to row in the carrier were destroyed. Attack of the protective surface also occurred by etchant penetration through the resist, or percolation under the resist edges. Dilution of $SF_6$ with an inert gas, such as argon or helium, decreases the degradation of the resist somewhat; however, at best, the results are marginal. To achieve the desired depth of etch, this etch rate ratio must be 5 or less.

It has now been found that when a small amount of a carbon-containing gas is added to the etch gas, both the etch rate for photoresist and for ceramic decrease. The etch rate for photoresist, however, decreased more than that for ceramic. A 13% addition of a carbon-containing gas depressed the reactive ion etch rate for photoresist by 25%, while the etch rate for ceramic was depressed by only 5%.

Satisfactory carbon-containing gases include $CF_4$, $C_2F_6$ and $CHF_3$. The most preferred gas is $CHF_3$.

Experimental results using various etch gas mixtures are shown in Tables 1 and 2 below.

TABLE 1

| | SF$_6$/ARGON GAS MIXTURES USED IN REACTIVE ION ETCH TOOL | | |
|---|---|---|---|
| Etch Gas Mixture (vol. percents) | Ceramic RIE Rate (μm/hr) | Photoresist RIE Rate (μm/hr) | Photoresist/Ceramic Etch Rate Ratio |
| 100% SF$_6$ | 3.4 | >20 | >6 |
| 75% SF$_6$ 25% Ar | 3.1 | >20 | >6 |
| 50% SF$_6$ 50% Ar | 3.1 | >20 | >6 |
| 39% SF$_6$ 61% Ar | 3.0 | ~18 | ~6 |
| 19% SF$_6$ 81% Ar | 1.2 | ~12 | ~10 |

TABLE 2

| SF$_6$/HELIUM/CARBON GAS MIXTURES USED IN REACTIVE ION ETCH TOOL | | | | Ceramic RIE Rate (μm/hr) | Photoresist RIE Rate (μm/hr) | Photoresist/Ceramic Etch Rate Ratio |
|---|---|---|---|---|---|---|
| Etch Gas Composition (vol. percents) | | | | | | |
| 50.0% SF$_6$ | 50.0% He | | | 4.04 | 23.0 | 5.9 |
| 26.7% SF$_6$ | 46.7% He | 26.6% | CF$_4$ | 3.13 | 14.7 | 4.7 |
| 0% SF$_6$ | 0% He | 100.0% | CF$_4$ | 1.90 | 7.6 | 4.0 |
| 44.1% SF$_6$ | 44.1% He | 11.8% | C$_2$F$_6$ | 3.81 | 21.0 | 5.5 |
| 38.0% SF$_6$ | 38.0% He | 24.0% | C$_2$F$_6$ | 3.48 | 17.7 | 5.1 |
| 26.7% SF$_6$ | 46.7% He | 26.7% | C$_2$F$_6$ | 3.40 | 17.1 | 5.0 |
| 40.0% SF$_6$ | 46.7% He | 13.3% | CHF$_3$ | 3.82 | 17.9 | 4.7 |
| 26.7% SF$_6$ | 46.7% He | 26.7% | CHF$_3$ | 3.08 | 11.3 | 3.7 |
| 45.0% SF$_6$ | 45.0% He | 10.0% | CHF$_3$ | 3.88 | 18.2 | 4.7 |

Our experiments indicate the optimum etch gas to be $SF_6$ with an approximately equal amount of a noble gas, and a small percentage, say about 10%, of a carbon-containing gas, preferably $CHF_3$. The best etch gas composition is 45% $SF_6$, 45% He and 10% $CHF_3$. Gases are mixed by mass flow controllers; therefore the percentages are volume percents.

The foregoing examples have been given solely for purposes of illustration and are not to be considered as limitations on the present invention, many variations of which are possible without departing from the spirit or scope thereof.

We claim:

1. In a reactive ion process for etching a ceramic partially masked by a photoresist, the improvement characterized by using an etch gas comprising $SF_6$, a noble gas and a small percent of a carbon-containing gas.

2. A process as claimed in claim 1 wherein the carbon-containing gas is present at about 10%.

3. A process as claimed in claim 1 wherein the carbon-containing gas is $CHF_3$.

4. A process as claimed in claim 1 wherein the etch gas is 45% $SF_6$, 45% He, and 10% $CHF_3$.

* * * * *